United States Patent
Lee et al.

(10) Patent No.: US 8,340,483 B2
(45) Date of Patent: Dec. 25, 2012

(54) OPTICAL INTERCONNECTION STRUCTURE AND METHOD FOR MANUFACTURING THE SAME

(75) Inventors: Yongtak Lee, Gwangju (KR);
Youngmin Song, Gwangju (KR);
Eunkyeong Min, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 673 days.

(21) Appl. No.: 12/430,094

(22) Filed: Apr. 26, 2009

(65) Prior Publication Data

US 2009/0290836 A1    Nov. 26, 2009

(30) Foreign Application Priority Data

Apr. 26, 2008  (KR) .................. 10-2008-0039080

(51) Int. Cl.
*G02B 6/32* (2006.01)
*G02B 6/12* (2006.01)
*G02B 6/13* (2006.01)

(52) U.S. Cl. .................................. 385/33; 385/14
(58) Field of Classification Search ............. 385/33
See application file for complete search history.

(56) References Cited

U.S. PATENT DOCUMENTS

| 4,989,934 | A | 2/1991 | Zavracky et al. |
| 7,085,079 | B2* | 8/2006 | Okazaki ................ 359/819 |
| 2003/0228109 | A1 | 12/2003 | Uekawa |
| 2006/0067607 | A1* | 3/2006 | Fang et al. ............. 385/14 |
| 2007/0036496 | A1* | 2/2007 | Gaebe .................. 385/94 |

FOREIGN PATENT DOCUMENTS

| EP | 0498169 A1 | 8/1992 |
| EP | 0562211 A1 | 9/1993 |
| EP | 1237019 A1 | 9/2002 |
| EP | 1332393 A1 | 8/2003 |
| JP | 5088029 A | 4/1993 |
| JP | 2006091241 A | 4/2006 |

OTHER PUBLICATIONS

European Search Report of Application No. 09158831.9 mailed on Jul. 22, 2009.

* cited by examiner

*Primary Examiner* — Omar Rojas

(57) ABSTRACT

The present invention relates to an optical interconnection structure and a method for manufacturing the same. The optical interconnection structure includes a silicon substrate on which at least one groove formed with a lens is formed to have a curvature radius on the upper surface thereof; and a silica layer that is formed on the silicon substrate including the groove formed with the lens to retain a shape of the groove formed with the lens. As a result, there are effects that the optical interconnection structure can be manufactured in great quantities by performing most of the processes using a semiconductor processing equipment and have better thermal characteristics than that of the existing PCB substrate.

7 Claims, 10 Drawing Sheets

[FIG. 1]
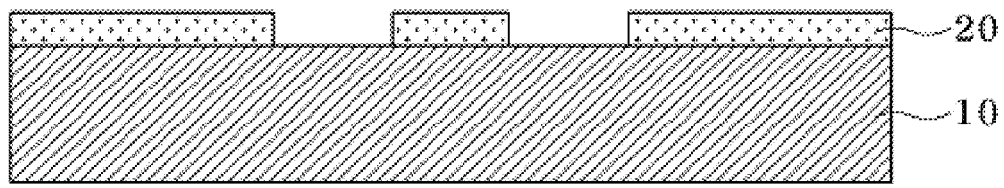
[FIG. 2]
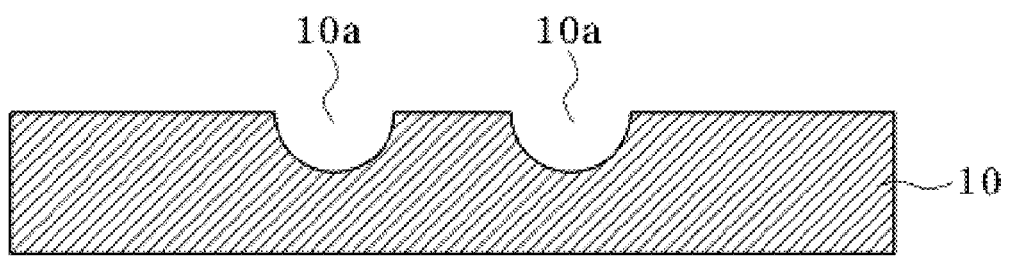
[FIG. 3]
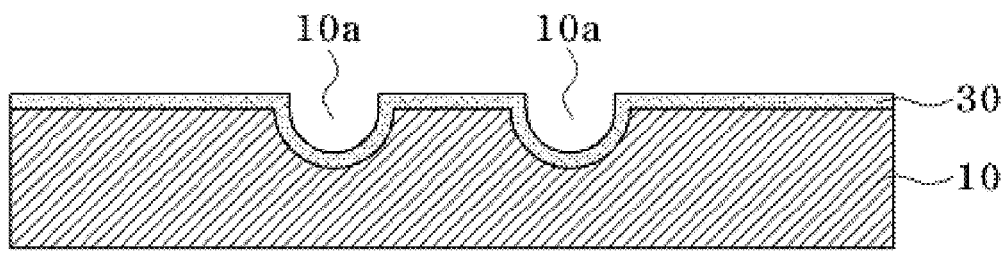
[FIG. 4]
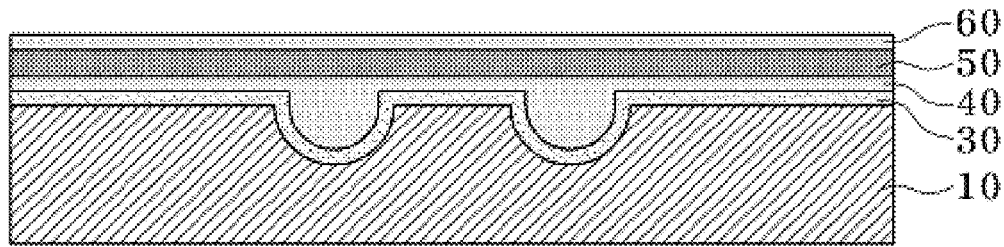

[FIG. 5]
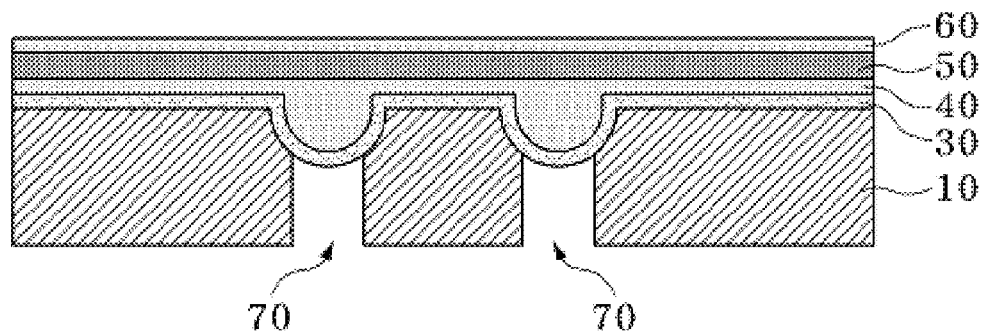
[FIG. 6]
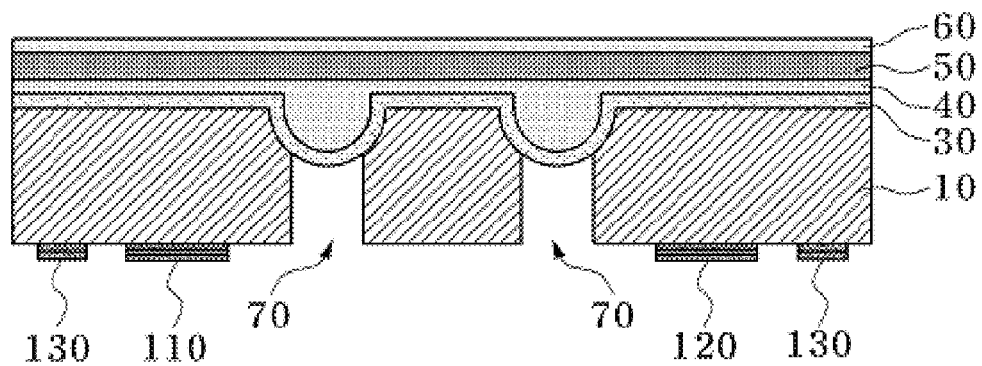
[FIG. 7]
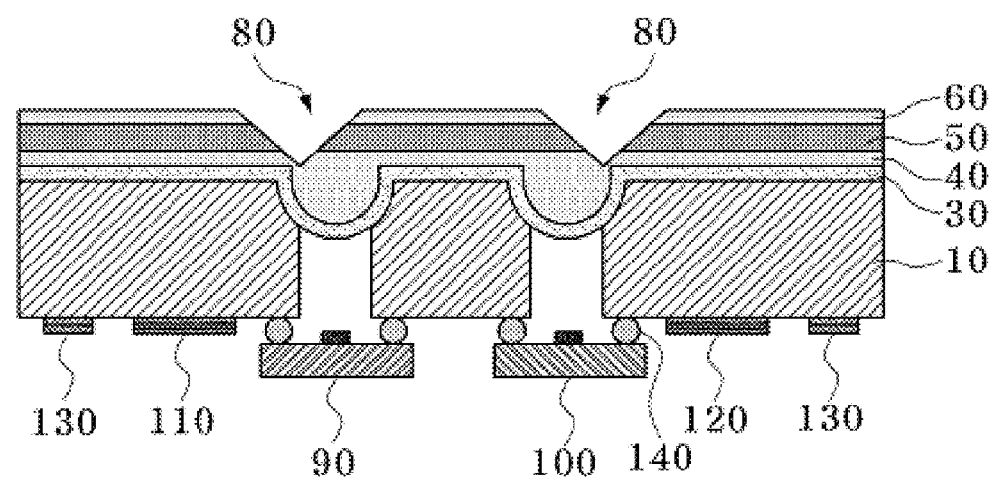

[FIG. 8]
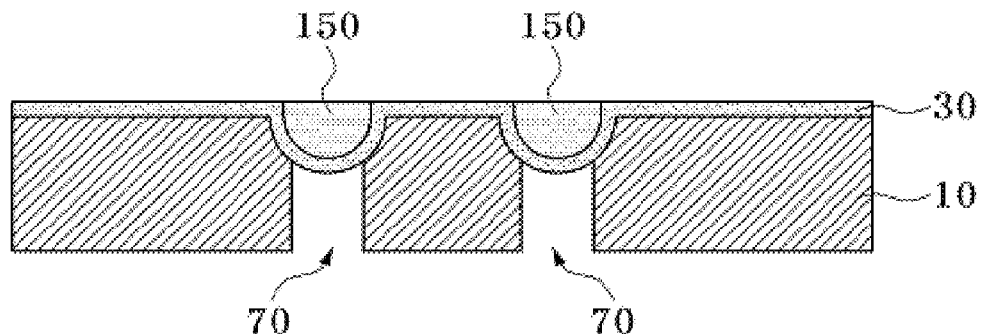
[FIG. 9]
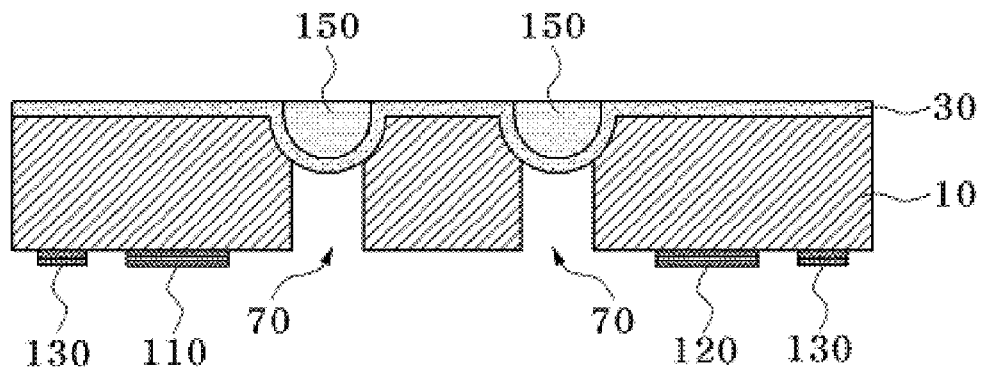
[FIG. 10]
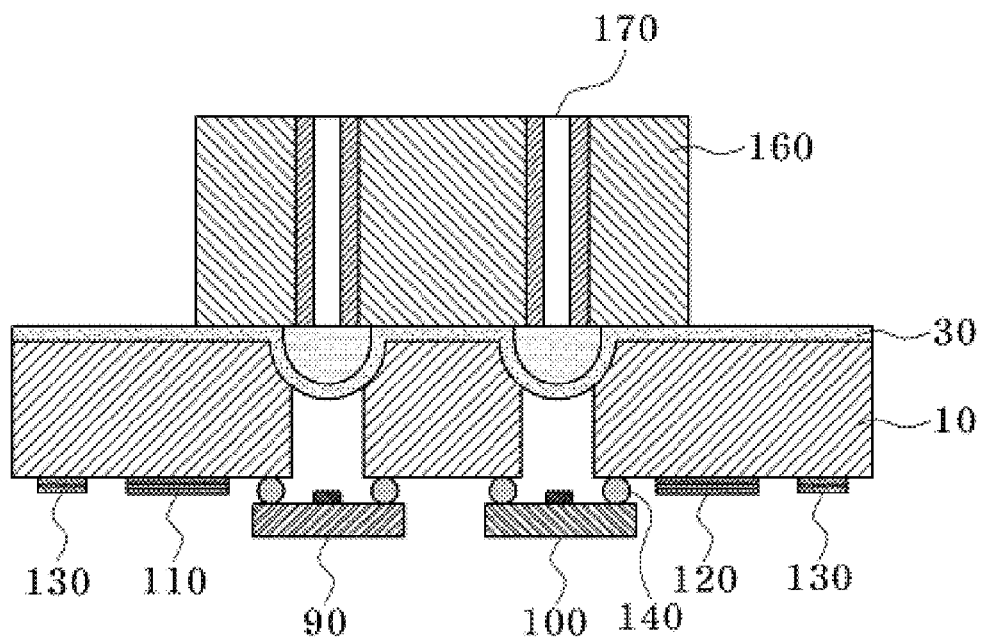

[FIG. 11]
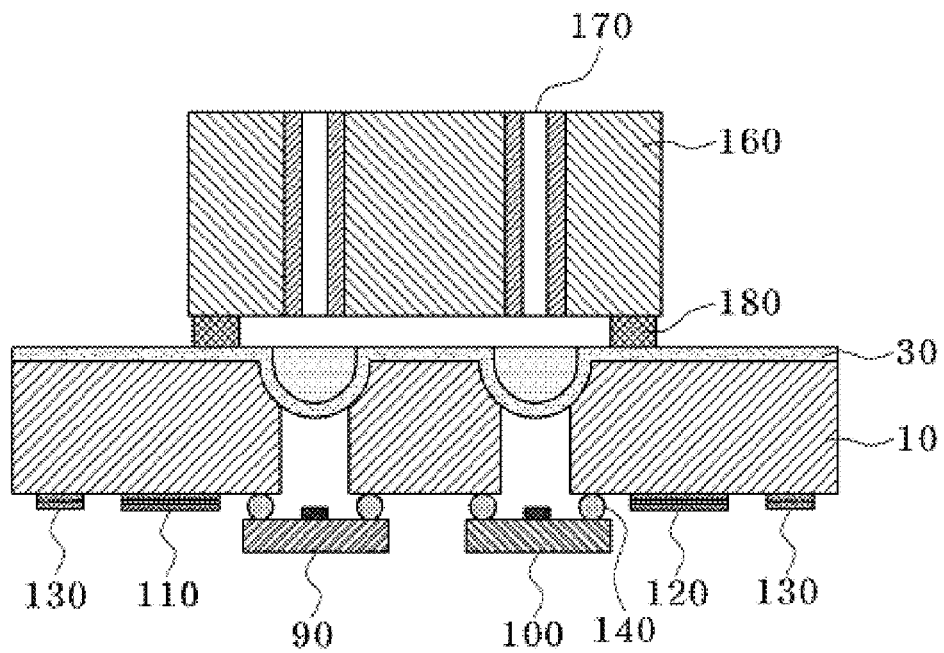
[FIG. 12]
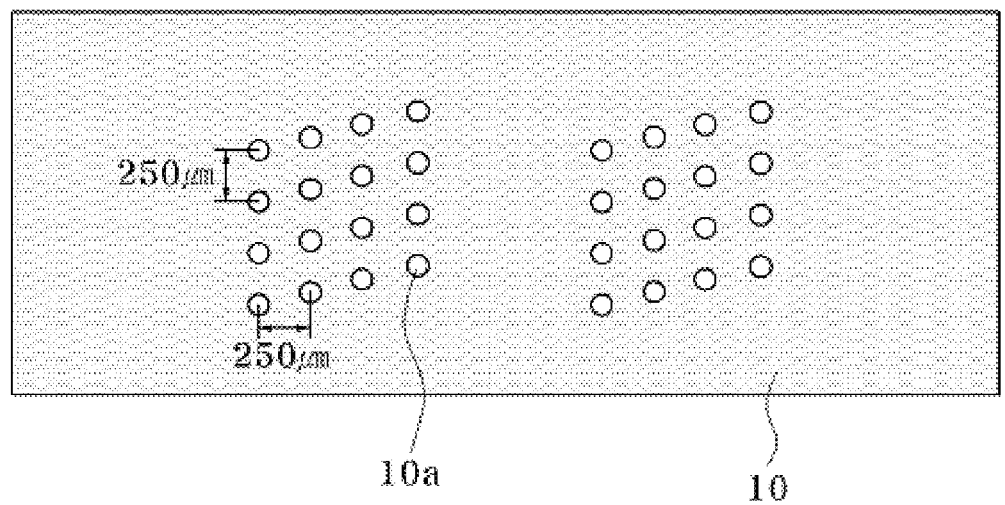

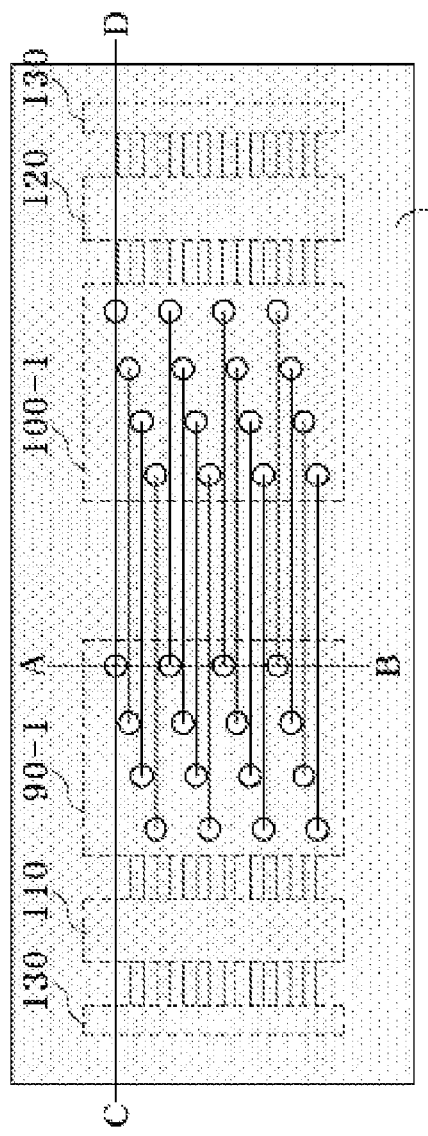
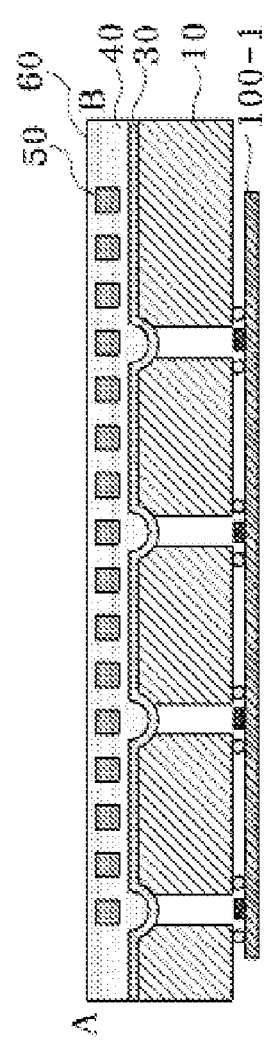
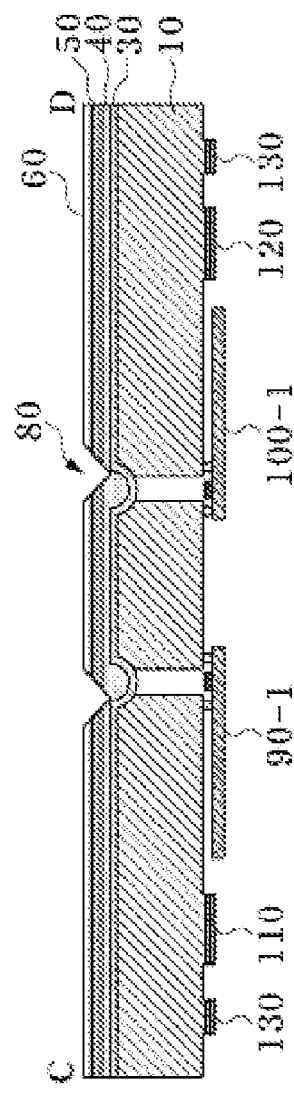
[FIG. 13A]
[FIG. 13B]
[FIG. 13C]

[FIG. 14]
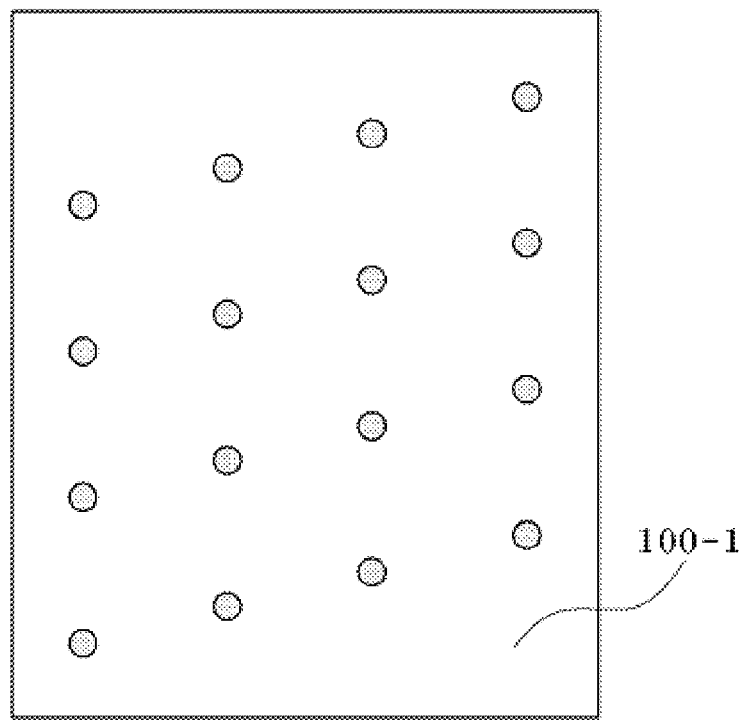
[FIG. 15]
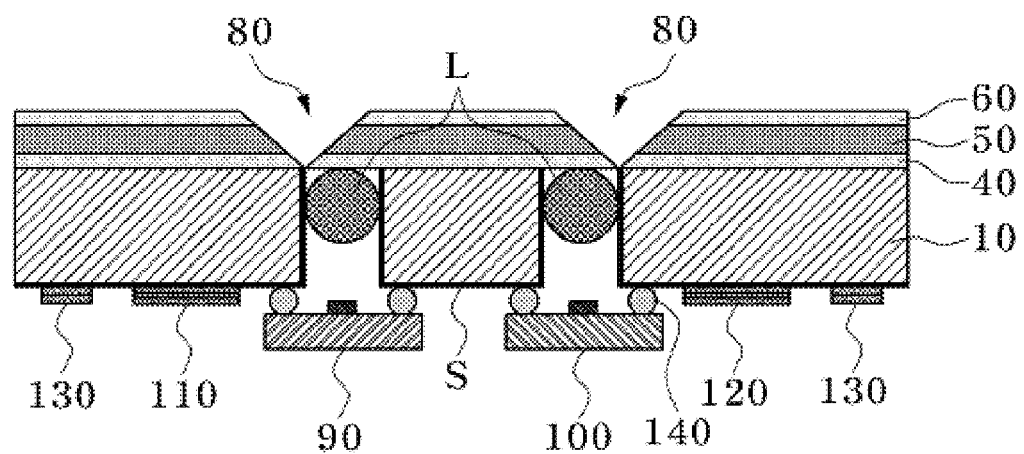

[FIG. 16]
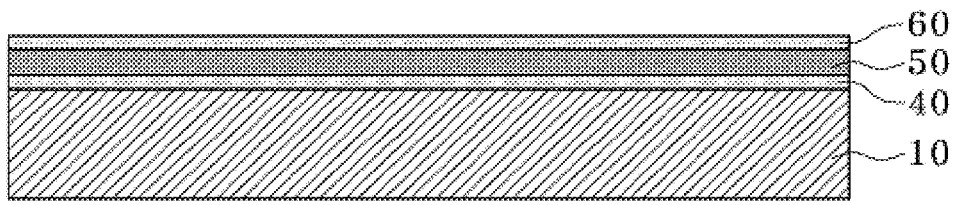
[FIG. 17]
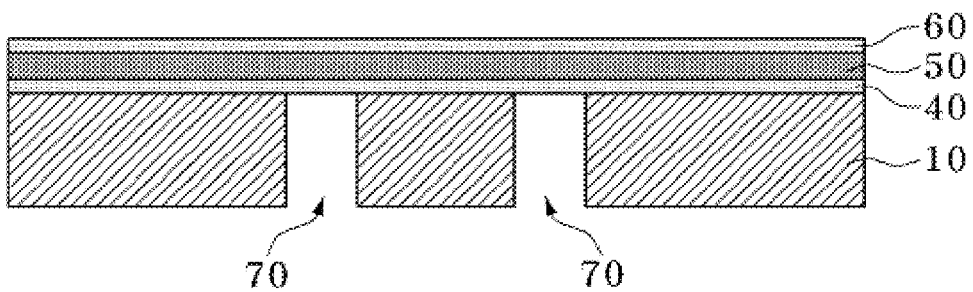
[FIG. 18]
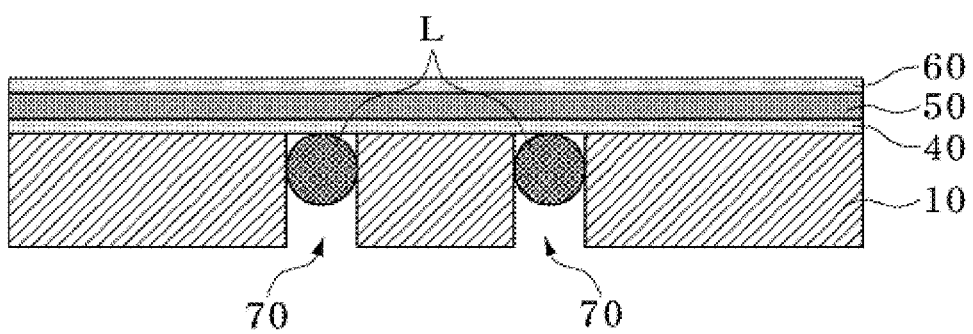
[FIG. 19]
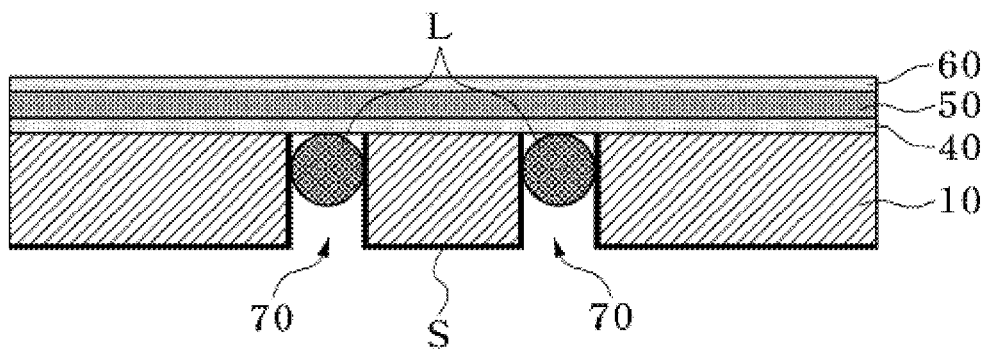

[FIG. 20]
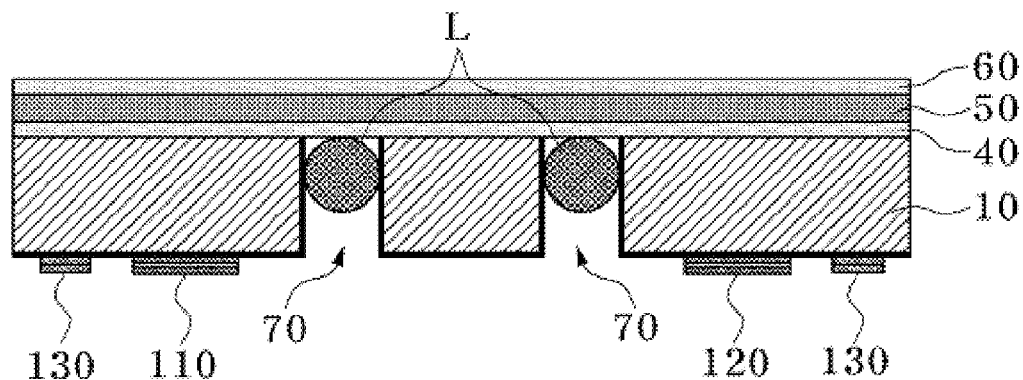
[FIG. 21]
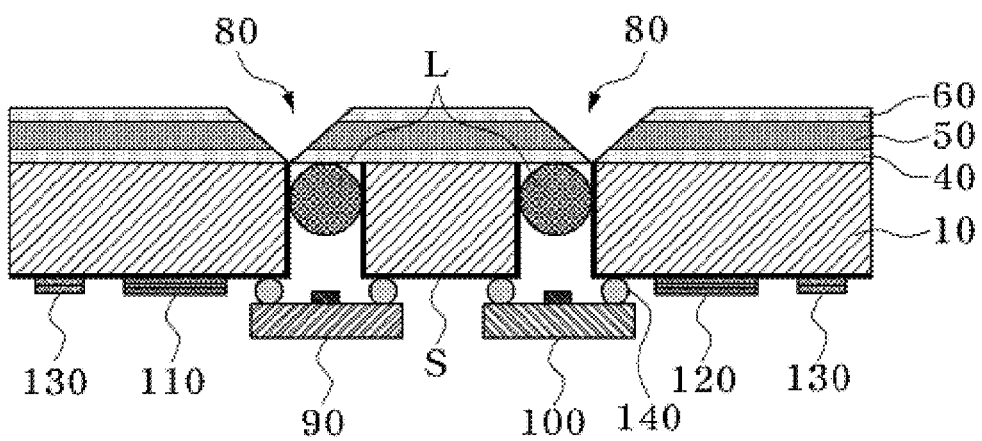
[FIG. 22]
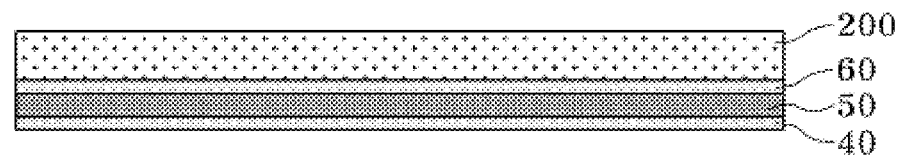

[FIG. 23]
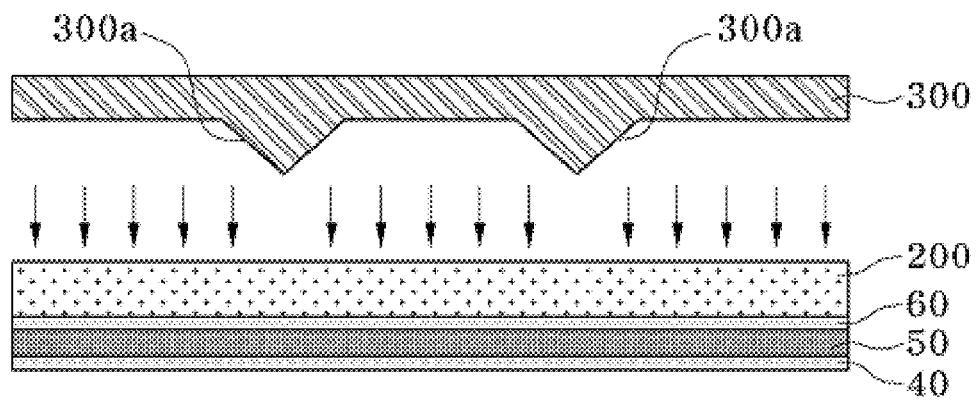
[FIG. 24]
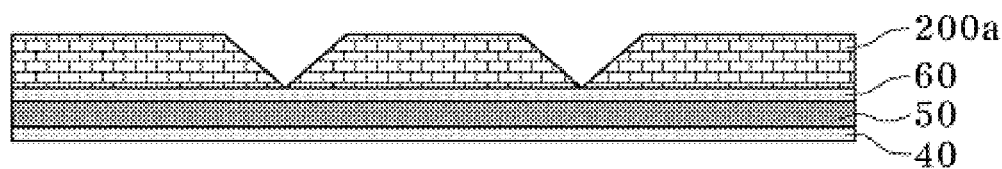
[FIG. 25]
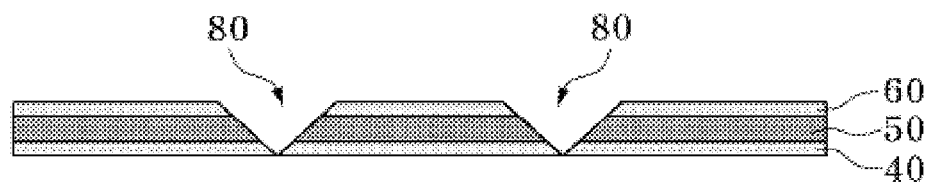
[FIG. 26]
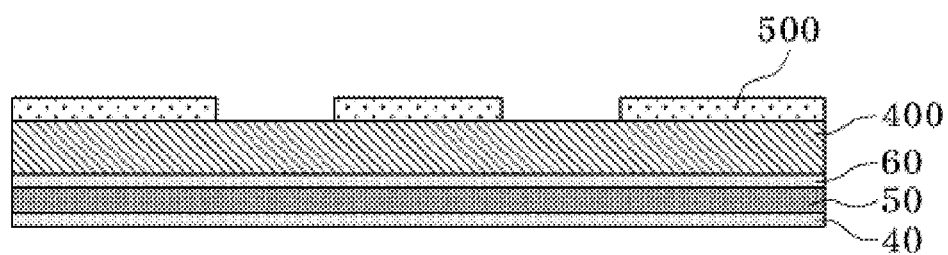

[FIG. 27]
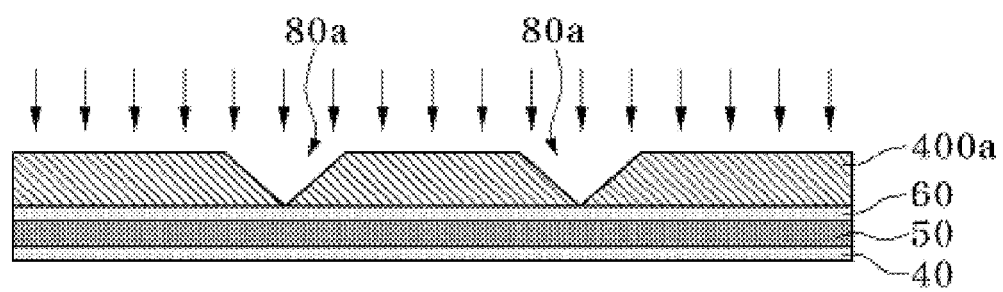
[FIG. 28]
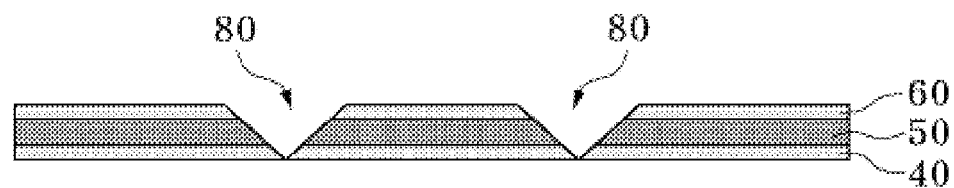

OPTICAL INTERCONNECTION STRUCTURE AND METHOD FOR MANUFACTURING THE SAME

BACKGROUND OF THE INVENTION

1. Field of the Invention

The present invention relates to an optical interconnection structure and a method for manufacturing the same, and more particularly, to an optical interconnection structure wherein silicon-based microlens is integrated, or a sphere-shaped ball lens is inserted and fixed inside via holes for an optical path formed on a silicon substrate and a method for manufacturing the same.

2. Description of the Related Art

Generally, an optical interconnection technology can resolve the limitation in a data transmission rate, a high crosstalk between interconnections, etc., which are problems of the existing electric interconnections. As a result, a study on the optical interconnection technology has been actively researched.

Such an optical interconnection technology may include, for example, a scheme using an optical fiber ribbon, an optical interconnection scheme through a free space, a scheme using a plane optical waveguide, etc., and has been developed to have different structures in accordance to the application fields.

Meanwhile, most of the optical interconnection technologies have manufactured the optical interconnection structure by modifying the existing printed circuit board (hereinafter, referred to as 'PCB'). As one example, the optical interconnection using the plane optical waveguide interconnects optical signals by using a grating coupler or a 45-degree reflector that vertically couples light on the PCB on which the optical waveguides are integrated.

In this case, since thermal characteristics of Fr4, which is a material used for the PCB substrate, are deteriorated and the semiconductor process cannot be performed, it is difficult to manufacture the optical interconnection structure in great quantities. Further, since a distance between the device and the optical waveguide is about several hundreds μm to several mm, it is disadvantageous in that a separate lens is needed.

SUMMARY OF THE INVENTION

The present invention proposes to solve the problems. It is an object of the present invention to provide an optical interconnection structure that can be manufactured in great quantities by using a silicon substrate and have better thermal characteristics than that of the existing PCB substrate and a method for manufacturing the same.

It is another object of the present invention to provide an optical interconnection structure that can be manufactured in great quantities by inserting and fixing a sphere-shaped ball lens inside via holes for an optical path formed on a silicon substrate and have better thermal characteristics than the existing PCB and a method for manufacturing the same.

In order to achieve the above object, according to a first aspect of the present invention, there is provided an optical interconnection structure including: a silicon substrate on which at least one groove formed with lenses is formed to have a curvature radius on the upper surface thereof; and a silica layer that is formed on the silicon substrate including the grooves formed with the lenses formed in order to provide the shape of the grooves formed with the lenses.

Preferably, the optical interconnection structure further includes via holes that are formed on a lower surface of the silicon substrate to expose a portion of the lower surface of the silica layer formed in the groove formed with the lens.

Preferably, the optical connection structure may further include an optical waveguide that is configured of a lower cladding layer formed on the whole upper surface of the silica layer to be buried into the groove formed with the lens on the silicon substrate, a core layer formed on the upper surface of the lower cladding layer, and an upper cladding layer formed on the upper surface of the core layer.

Preferably, when for the grooves formed with the lenses and the via holes, respectively, two grooves for first and second lenses and first and second via holes that are spaced from each other at a predetermined interval are provided, the optical interconnection structure further includes a laser diode and a photodiode that are each attached to the lower surface of the silicon substrate to close the first and second via holes and a driver for driving the laser diode and a receiver for converting received optical signals into electric signals that may be each attached to one side of the lower surface of the silicon substrate.

Preferably, the optical interconnection structure further includes first and second mirror grooves inclined at a predetermined angle formed to be opposite to each other on the upper surface of the optical waveguide positioned on the grooves in order to form the first and second lenses.

Preferably, the first and second mirror grooves may be inclined at 45° in a V-letter shape to be opposite to each other from a ground or in a right triangular shape inclined at 45° to be opposite to each other in a direction between the grooves formed with the first and second lenses.

Preferably, the optical interconnection structure may further include a microlens that is formed on the silica layer to be buried into the groove formed with the lens on the silicon substrate.

Preferably, when for the grooves formed with the lenses, the via holes, and the microlenses, respectively, two grooves for the first and second lenses, the first and second via holes, and the first and second microlenses that are spaced from each other at a predetermined interval are provided, the optical interconnection structure further includes a laser diode and a photodiode that are each attached to the lower surface of the silicon surface so as to close the first and second via holes, a driver for driving the laser diode and a receiver for converting the received optical signals into electric signals that are each attached to one side of the lower surface of the silicon substrate, and an optical interconnection member having first and second fibers incorporated therein that is attached to the upper surface of the silica layer, wherein the optical interconnection member may be attached to the upper surface of the silica layer to transmit light to the first and second microlenses through the first and second optical fibers.

Preferably, the optical interconnection member and the silica layer may be attached to each other to be spaced at a predetermined interval by using a spacer. Preferably, the curvature radius of the groove formed with the lens may be in a range of 50 μm to 200 μm.

According to a first aspect of the present invention, there is provided an optical interconnection structure including: a silicon substrate including at least one via hole for an optical path; and a sphere-shaped ball lens that is inserted and fixed inside the upper side of the via hole to refract incident light.

Preferably, the optical connection structure may further include an optical waveguide that is configured of a lower cladding layer formed on the whole upper surface of the silicon substrate, a core layer formed on the upper surface of the lower cladding layer, and an upper cladding layer formed on the upper surface of the core layer.

Preferably, when for the via holes, two first and second via holes that are each spaced from each other at a predetermined interval are provided, the optical connection structure further includes a laser diode and a photodiode that are each attached to the lower surface of the silicon substrate to close the first and second via holes and a driver for driving the laser diode and a receiver for converting received optical signals into electric signals that may be each attached to one side of the lower surface of the silicon substrate.

Preferably, first and second mirror grooves inclined at a predetermined angle may be further formed to be opposite to each other on the upper surface of the optical waveguide positioned on the first and second via holes.

Preferably, the first and second mirror grooves may be inclined at 45° in a V-letter shape to be opposite to each other from a ground or in a right triangular shape inclined at 45° to be opposite to each other in a direction between the first and second via holes.

Preferably, the front surface of the silicon substrate is formed with an oxide layer, such that the contacting portion of the inner circumferential portion of the via hole can be attached to the ball lens due to the volume expansion of the inner circumferential portion of the via hole contacting the ball lens.

According to a third aspect of the present invention, there is provided a method for manufacturing an optical interconnection structure including: (a) forming at least one groove formed with a lens to have a curvature radius on the upper surface of the silicon substrate; and (b) forming a silica layer on the entire upper surface of the silicon substrate including the groove for a lens in order to retain a shape of the groove formed with the lens.

Preferably, step (a) includes (a-1) forming a mask pattern on the upper surface of the silicon substrate; and (a-2) forming at least one groove for a lens having the curvature radius by etching the upper surface of the silicon substrate using a wet or dry etching method.

Preferably, the wet etching method performs the etching with a solution prepared by mixing hydrofluoric acid, nitric acid, and acetic acid solutions at a predetermined percentage and etching rate, surface roughness, and a degree of isotropy can be controlled according to volume percentage.

Preferably, the method for manufacturing an optical interconnection structure may further include forming an optical waveguide by sequentially stacking a lower cladding layer, a core layer, and an upper cladding layer on the whole upper surface of the silicon substrate.

Preferably, the method for manufacturing an optical interconnection structure may further include forming via holes on the lower surface of the silicon substrate to expose a portion of the lower surface of the silica layer formed in the groove formed with the lens.

Preferably, when for the grooves formed with the lenses and the via holes, respectively, two grooves formed with first and second lenses and first and second via holes that are spaced from each other at a predetermined interval are provided, the method for manufacturing an optical interconnection structure may further include attaching a laser diode and a photodiode, respectively, to the lower surface of the silicon surface to close the first and second via holes and attaching a driver for driving the laser diode and a receiver for converting received optical signals into electric signals to one side of the lower surface of the silicon substrate.

Preferably, the method for manufacturing an optical interconnection structure may further include forming first and second mirror grooves inclined at a predetermined angle to be opposite to each other on the upper surface of the optical waveguide positioned on the grooves formed with the first and second lenses.

Preferably, the first and second mirror grooves may be inclined at 45° in a V-letter shape so as to be opposite to each other from a ground by using a laser or a blade or in a right triangular shape inclined at 45° to be opposite to each other in a direction between the grooves formed with the first and second lenses.

Preferably, the method for manufacturing an optical interconnection structure may further include forming microlenses on the silica layer to be buried into the groove formed with the lens on the silicon substrate.

Preferably, when for the groove formed with the lens, the via hole, and the microlens, respectively, the two grooves formed with the first and second lenses, the first and second via holes, and the first and second microlenses that are spaced from each other at a predetermined interval are provided, the method for manufacturing an optical interconnection structure further includes attaching the laser diode and the photodiode, respectively to the lower surface of the silicon surface to close the first and second via holes, attaching the driver for driving the laser diode and the receiver for converting the received optical signals into electric signals to one side of the lower surface of the silicon substrate, and attaching an optical interconnection member having first and second fibers incorporated therein to the upper surface of the silica layer, wherein the optical interconnection member may be attached to the upper surface of the silica layer to transmit light to the first and second microlenses through the first and second optical fibers.

Preferably, the optical interconnection member and the silica layer may be attached to each other be spaced at a predetermined interval by using a spacer.

Preferably, the curvature radius of the groove for a lens may be in a range of 50 μm to 200 μm.

According to a fourth aspect of the present invention, there is provided a method for manufacturing an optical interconnection structure including: (a') forming at least one via hole for forming an optical path on a silicon substrate; and (b') inserting and fixing a sphere-shaped ball lens inside the upper side of the via hole to refract incident light.

Preferably, the method for manufacturing an optical interconnection structure may further include forming an optical waveguide by sequentially stacking a lower cladding layer, a core layer, and an upper cladding layer on the whole upper surface of the silicon substrate.

Preferably, when for the via holes, two first and second via holes that are each spaced from each other at a predetermined interval are provided, the method for manufacturing an optical interconnection structure further includes attaching a laser diode and a photodiode, respectively, to the lower surface of the silicon substrate to close the first and second via holes and attaching a driver for driving the laser diode and a receiver for converting received optical signals into electric signals to one side of the lower surface of the silicon substrate.

Preferably, the method for manufacturing an optical interconnection structure may further include forming first and second mirror grooves inclined at a predetermined angle so as to be opposite to each other on the upper surface of the optical waveguide positioned on the first and second via holes.

Preferably, the first and second mirror grooves may be inclined at 45° in a V-letter shape so as to be opposite to each other from a ground by using an implant lithography process or in a right triangular shape inclined at 45° to be opposite to each other in a direction between the first and second via holes.

Preferably, the implant lithography process may include: a first process of applying a resist layer on the optical waveguide; a second process of forming a resist pattern for forming the mirror grooves by pressurizing the upper surface on the resist layer at a predetermined pressure through a contact of the upper surface and a stamper on which the pattern for forming the mirror grooves is formed and then exposing the upper surface of the resist layer with ultraviolet rays or applying heat to the upper surface of the resist layer; and a third process of forming the first and second mirror grooves on the optical waveguide by removing the remaining resist by the dry etching using the resist pattern as an etch stop mask.

Preferably, the first and second mirror grooves are inclined at 45° in a V-letter shape so as to be opposite to each other from a ground or in a right triangular shape inclined at 45° to be opposite to each other in a direction between the first and second via holes. Further, the implant lithography process may include: a first process of the silicon layer having a predetermined thickness on the optical waveguide; a second process of forming a mask pattern to form auxiliary mirror grooves on the silicon layer; a third process of forming a silicon pattern by forming first and second auxiliary mirror grooves in the same shape as the first and second mirror grooves and then removing the mask pattern; and a fourth process of forming the first and second mirror grooves on the optical waveguide by removing the remaining silicon layer by dry etching using the silicon pattern as an etch stop mask.

With the optical interconnection structure and the method for manufacturing the same of the present invention as described above, the optical interconnection structure integrated microlenses using the silicon substrate is manufactured, such that it can be manufactured in great quantities by performing most of the processes using the semiconductor processing equipment and have better thermal characteristics than that of the existing PCB substrate.

Further, with the present invention, there is no need to mount additional separate lenses because the optical interconnection structure are integrated with the microlenses.

BRIEF DESCRIPTION OF THE DRAWINGS

FIGS. 1 to 7 are cross-sectional views for explaining a method for manufacturing an optical interconnection structure according to a first embodiment of the present invention;

FIGS. 8 to 11 are cross-sectional views for explaining a method for manufacturing an optical interconnection structure according to a second embodiment of the present invention;

FIGS. 12 to 14 are cross-sectional views for explaining a method for manufacturing an optical interconnection structure according to a third embodiment of the present invention, wherein FIG. 13A is a plan view illustrating the optical interconnection structure according to the third embodiment of the present invention, FIG. 13B is a cross-sectional view taken along line A-B in FIG. 13A, and FIG. 13C is a cross-sectional view taken along line C-D in FIG. 13A;

FIG. 15 is a cross-sectional view for explaining an optical interconnection structure according to a fourth embodiment of the present invention;

FIGS. 16 to 21 are cross-sectional views for explaining a method for manufacturing an optical interconnection structure according to a fourth embodiment of the present invention;

FIGS. 22 to 25 are cross-sectional views for explaining one example of a method of forming mirror grooves to which the fourth embodiment of the present invention is applied; and FIGS. 26 to 28 are cross-sectional views for explaining another example of a method of forming the mirror grooves to which the fourth embodiment of the present invention is applied.

DETAILED DESCRIPTION OF THE PREFERRED EMBODIMENTS

Hereinafter, embodiments of the present invention will be described with reference to the accompanying drawings. However, the embodiments of the present invention to be described below can be varied in various forms and the scope of the present invention is not limited to the embodiments to be described below. The embodiments of the present invention are provided so that those skilled in the art may more thoroughly understand the present invention.

First Embodiment

FIGS. 1 to 7 are cross-sectional views for explaining a method for manufacturing an optical interconnection structure according to a first embodiment of the present invention.

First, a basic configuration of an optical interconnection structure according to a first embodiment of the present invention is largely configured to include a silicon substrate 10 and a silica layer 30.

Herein, at least one groove 10a for a lens is provided to have a predetermined curvature radius on the upper surface of the silicon substrate 10 (see FIG. 2). Such a groove 10a for a lens may be formed, for example, in a semi-spherical shape and the curvature radius thereof may be in a range of about 50 μm to 200 μm.

And, the silica layer 30 is formed at a thickness of several μm on the upper surface of the silicon substrate 10, the upper surface of the silicon substrate including the groove 10a for a lens to retain the shape of the groove 10a for a lens as it is (see FIG. 3).

Additionally, the optical interconnection structure may further includes via holes 70 that are formed on the lower surface of the silicon substrate 10 to expose a portion (preferably, a central portion) of the lower surface of the silica layer 30 formed in the groove 10a for the lens.

Further, the optical interconnection structure may further include an optical waveguide that is configured of a lower cladding layer 40 formed on the entire upper surface of the silica layer 30 to be buried into the groove 10a for a lens of the silicon substrate 10, a core layer 50 that is formed on the upper surface of the lower cladding layer 40, and an upper cladding layer 60 that is formed on the upper surface of the core layer 50 may further provided.

Further, as shown in FIGS. 2 to 7, when the groove 10a for a lens and the via hole 70 are formed having two grooves and two lens that are spaced from each other at a predetermined interval, the optical interconnection structure may further include a laser diode (LD) 90 and a photodiode (PD) 100 each attached to the lower surface of the silicon substrate 10 by a solder pump 140, etc. to close each via hole 70.

At this time, the photodiode 100 preferably uses, for example, a resonant cavity (RC) photodiode, an o-i-n photodiode, a photodiode having a metal-semiconductor-metal (MSM) structure, an avalanche photodiode, etc.

In addition, a driver 110 for driving a laser diode 90, a receiver 120 for converting received optical signals into electric signals, a very large scale integrated circuit VLSI 130, etc., each may be attached to one side of the lower surface of the silicon substrate 10.

Moreover, a pair of mirror grooves 80 inclined at a predetermine angle to be opposite to each other, for example, by using a laser or a blade may further be formed on the upper surface of the optical waveguide positioned on each of the grooves 10a for the lenses.

Preferably, the pair of mirror grooves 80 is inclined at a predetermined angle (preferably, about 45°) in a V-letter shape so as to be opposite to each other from a ground but is not limited thereto. Therefore, the pair of mirror grooves 80 may be formed in a right triangular shape inclined at 45° to be opposite to each other in a direction between the respective grooves 10a formed with the lenses. Further, in order to further increase reflectivity, a metal may be deposited on the inclined surface of the mirror groove 80.

Hereinafter, a method for manufacturing the optical interconnection structure according to the first embodiment of the present invention will be described in detail.

Referring to FIG. 1, a circular mask pattern 20 is formed on the silicon substrate 10 by a typical photolithography process. At this time, as the mask pattern 20, for example, photoresist, $SiO_2$, or SiNx, etc., can be used.

Referring to FIG. 2, a lens curved surface having a radius of about 50 μm to 200 μm, that is, the groove 10a for a lens is formed by etching the silicon substrate 10, for example, using a wet or dry etching method and the mask pattern 20 is then removed.

At this time, the wet etching method of the silicon substrate 10 may use a solution (for example, HNA, etc.) prepared by mixing hydrofluoric acid, nitric acid, and acetic acid solutions, wherein etching rate, surface roughness, a degree of isotropy, etc. can be controlled according to a volume percentage of each solution.

Meanwhile, the silicon substrate 10 may be etched by using a chemical vapor etching (CVE). At this time, the chemical vapor etching of the silicon substrate 10 can be performed by exposing the silicon substrate 10 to a vaporous acid that is a mixture of hydrofluoric acid and nitric acid and etching rate, surface roughness, a degree of isotropy, etc. can be controlled according to a volume percentage of each solution and a temperature upon vaporizing, etc.

Referring to FIG. 3, on the silicon substrate 10 having the groove 10a with formed a lens is formed the silica layer 30 of several μm, for example, by using an oxidation method, a chemical vapor deposition (CVD) method, a sputtering method, a flame hydrolysis deposition (FHD) method, a sol-gel method, etc.

At this time, the oxidation method may use general oxidation methods, such as a wet oxidation method, a dry oxidation method, a high-pressure oxidation method.

Meanwhile, the silica layer 30 is preferably formed on the whole upper surface of the silicon substrate 10 including the groove 10a formed with the lens to retain the shape of the groove 10a formed with the lens as it is.

Referring to FIG. 4, a lower cladding layer 40, a core layer 50, and an upper cladding layer 60 are sequentially stacked on the whole upper surface of the silica layer 30 to form the optical waveguide.

At this time, as materials for forming the lower and upper cladding layers 40 and 60 and the core layer 50, for example, polymer, silica, etc., may be used and as methods for forming the lower and upper cladding layers 40 and 60 and the core layer 50, in the case of the polymer material, for example, a photolithography method, an RIE method, a molding method, a hot embossing method, an UV patterning method, a laser direct writing method, etc., that are used in the semiconductor process may be used.

Meanwhile, in the case of the silica material, the chemical vapor deposition (CVD) method, the sputtering method, the flame hydrolysis deposition (FHD) method, the sol-gel method, etc., may be used.

In particular, when forming the lower cladding layer 40, the same material is filled up to the groove 10a formed with the lens and the upper surface of the lower cladding layer 40 is formed to be planarized. If needed, the upper surface of the lower cladding layer 40 may be planarized by a chemical mechanical polishing (CMP) process.

Referring to FIG. 5, the via hole 70 is formed on the lower surface of the silicon substrate 10 having the groove 10a formed with the lens. The via hole 70 may be formed, for example, by using an anisotropic etching, which etches to expose the groove 10a formed with the lens, that is, to expose a portion of the lower surface of the silica layer 30.

Further, since the groove 10a formed with the lens is deformed due to the silica, the etching is performed by a material performing a selective etching between the silicon and the silica to retain the shape of the groove 10a formed with the lens as it is.

Referring to FIG. 6, a driver 110 for driving the laser diode 90 (see FIG. 7) according to electric signals and a photodiode receiver, that is, the receiver 120, that converts received optical signals into electric signals, the VLSI 130, etc., are form on the lower surface of the silicon substrate 10 by a general complementary metal oxide semiconductor (CMOS) process.

Referring to FIG. 7, the pair of mirror grooves 80 inclined at a predetermined angle (preferably, about 45°) are formed on the upper surface of the optical waveguide positioned on the groove 10a formed with each lens.

Thereafter, the laser diode 100 and the photodiode 110 each is attached to the lower surface of the silicon substrate 10 by using the solder pump 140 to close each via hole 70.

At this time, the mirror groove 80 may be formed by using the laser or the blade, etc., and in order to increase the reflectivity of the mirror groove 80, the metal may be deposited on the portion of the inclined surface.

Second Embodiment

FIGS. 8 to 11 are cross-sectional views for explaining a method for manufacturing an optical interconnection structure according to a second embodiment of the present invention.

Referring to FIG. 8, after performing the processes up to FIG. 3 described above, the via hole 70 is formed on the lower surface of the silicon substrate 10. The via hole 70 is formed in the same method as the first embodiment of the present invention described above and therefore, the description thereof will not be repeated.

Then, the polymer or silica-based materials are filled on the silica layer 30 to be buried into the groove 10a formed with the lens (see FIG. 3) to form a microlens 150.

At this time, the upper surface of the material filled in the microlens 150 is planarized and if needed, can be planarized, for example, by the front etching or the CMP process.

Referring to FIG. 9, the driver 110, the receiver 120, the VLSI 130, etc., are formed on the lower surface of the silicon substrate 10 similar to FIG. 6 described above.

Referring to FIG. 10, an optical interconnection member 160 (for example, MT ferrule, etc.) having an optical fiber 170 incorporated therein is attached to the upper portion of the silicon substrate 10 and similar to FIG. 7 described above, the laser diode 100 and the photodiode 110 each is attached to the lower surface of the silicon substrate 10 by the solder pump 140, etc. to close each via hole 70.

At this time, the optical interconnection member 160 and the silicon substrate 10 is directly attached to each other, for example, by using a guide pin or if needed, may be spaced from each other by using a spacer 180 (see FIG. 11).

Meanwhile, the optical interconnection member 160 is preferably attached to the upper surface of the silica layer 30 to transmit light to the microlens 150 through the optical fiber 170.

On the other hand, the optical fiber 170 built in the optical interconnection member 160 preferably uses the multi mode optical fiber having a size of about 50 μm to 100 μm and if needed, may use a single mode optical fiber by using the spacer.

Third Embodiment

FIGS. 12 to 14 are plan views and cross-sectional views for explaining a method for manufacturing an optical interconnection structure according to a third embodiment of the present invention and are plan views and cross-sectional views showing an optical interconnection structure for 4×4 channel parallel optical interconnection.

Referring to FIG. 12, the lens curved surface, that is, the groove 10*a* formed with the lens is formed on the silicon substrate 1 to array the plurality of laser diodes (LD) and photodiodes (PD).

Referring to FIGS. 13A-C, after performing the processes of FIGS. 1 to 5 described above, similar to FIGS. 6 and 7 described above, a diode 90-1 and a photodiode 100-1, which are arrayed, are attached to the lower surface of the silicon substrate 10 after the driver 110, the receiver 120, the VLSI 130, etc., that drives all the devices arrayed on the lower surface of the silicon substrate 10 or if needed, individually drives them are formed by the general CMOS process.

At this time, the laser diode array is made by an arrangement 4×4 channel parallel optical connection as shown in FIG. 14 in order to increase the integrated degree while retaining the interval between the general laser diodes to about 250 μm.

Fourth Embodiment

FIG. 15 is a cross-sectional view for explaining an optical interconnection structure according to a fourth embodiment of the present invention.

Referring to FIG. 15, the optical interconnection structure according to the fourth embodiment of the present invention is largely configured to include the silicon substrate 10 including the at least one via hole 70, a lens (L) that is inserted and fixed inside the via hole 70 to refract incident light, the optical waveguide configured by sequentially stacking the lower cladding layer 40, the core layer 50, and the upper cladding layer 60 that are formed on the whole upper surface of the silicon substrate 10 to transmit the optical signals, and the laser diode (LD) 90 and the photodiode (PD) 100 that each is attached to the lower surface of the silicon substrate 10.

Herein, the at least one via hole 70 for performing a role of an optical path is formed on the silicon substrate 10, for example, by an anisotropic etching.

Further, the thickness of the silicon substrate 10 is not limited, but the substrate thickness in the range of about 0.1 mm to 5 mm may be generally used according to applications. The substrate surface may use surfaces such as [100], [110], [111], [211], etc. However, it is preferable to apply the silicon substrate of the [100] surface that has been the most widely used as the silicon substrate.

The lens (L) is made of, for example, silica, glass, etc. For example, it is preferable that the lens is implemented by a sphere-shaped ball lens. When inserting inside the via hole 70, a portion protruded to the upper portion of the substrate surface may be polished to be planarized. The portion of the inner circumferential surface of the via hole 70 contacting the lens (L) may be tightly bonded by using epoxy, etc.

And, the optical waveguide is configured of the lower cladding layer 40 formed on the whole upper surface of the silicon substrate 10, the core layer 50 formed on the upper surface of the lower cladding layer 40, and the upper cladding layer 60 formed on the upper surface of the core layer 50.

Further, the pair of mirror grooves 80 inclined at a predetermined angle to be opposite to each other may be further formed on the upper surface of the optical waveguide positioned on each via hole 70, for example, by using the laser or the blade.

The pair of mirror grooves 80 are preferably formed in a V-letter inclined at a predetermined angle (preferably, about 45°) to be opposited to each other from a ground but are not limited thereto and in a right triangular shape inclined at 45° to be opposite to each other in a direction between the respective via holes 70. In order to increase the reflectivity, a metal may be deposited on the inclined surface of the mirror groove 80.

Further, when for each of the via holes 70, two via holes that are spaced from each other at a predetermined interval are provided, the laser diode 90 and the photodiode 100 each is attached to the lower surface of the silicon substrate by using the solder pump 140, etc., to close the via holes 70.

At this time, the photodiode 100 preferably uses, for example, the resonant cavity (RC) photodiode, the o-i-n photodiode, the photodiode having a metal-semiconductor-metal (MSM) structure, the avalanche photodiode, etc.

In addition, the driver 110 for driving the laser diode 90, the receiver 120 for converting received optical signals into electric signals, the very large scale integrated circuit (VLSI) 130, etc., each may be attached to one side of the lower surface of the silicon substrate 10.

Hereinafter, the method for manufacturing the optical interconnection structure according to the fourth embodiment of the present invention will be described in detail.

FIGS. 16 to 21 are cross-sectional views for explaining the method for manufacturing an optical interconnection structure according to the fourth embodiment of the present invention Referring to FIG. 16, the lower cladding layer 40, the core layer 50, and the upper cladding layer 60 are sequentially stacked on the whole upper surface of the silicon substrate 10 to form the optical waveguide.

At this time, as the materials for forming the lower and upper cladding layers 40 and 60 and the core layer 50, polymer, silica, etc. may be used and as the methods for forming the lower and upper cladding layers 40 and 60 and the core layer 50, in the case of the polymer material, for example, the photolithography method, the reactive ion etching (RIE) method, the molding method, the hot embossing method, the UV patterning method, the laser direct writing method, etc., that are used in the semiconductor process may be used.

Meanwhile, in the case of the silica material, for example, the chemical vapor deposition (CVD) method, the sputtering method, the flame hydrolysis deposition (FHD) method, the sol-gel method, etc., may be used.

Referring to FIG. 17, the via hole 70, which is the optical path having a cross section vertical to the silicon substrate 10, is formed on the lower surface of the silicon substrate 10. The via hole 70 may be formed, for example, by an anisotropic etching such as a plasma ion etching (PIE), etc., which performs the etching to expose the lower cladding layer 40 of the optical waveguide.

Referring to FIGS. 18 and 19, after the sphere-shape ball lens (L) is, for example, inserted inside each via hole 70, an oxidation layer (S) is formed on the front surface of the silicon substrate 10, such that the contacting portion of the inner circumferential portion can be attached to the lens (L) due to the volume expansion of the inner circumferential portion of the via hole 70 contacting the lens (L).

At this time, as described above, the oxidation method may use the general silicon oxidation method and the oxidation layer (S) formed on the front surface of the silicon substrate 10 is oxidized other than some regions if needed or may be removed performing the etching, etc., on some regions after the oxidation.

Meanwhile, the portion of the inner circumferential surface of the via hole 70 contacting the lens (L) may be tightly bonded for example, by using epoxy, etc. Further, the portion of the inner circumferential surface of the via hole 70 contacting the lens (L) is applied with high temperature, such that the contacting portion can be attached by physical characteristics.

Referring to FIG. 20, the driver 110 for driving the laser diode 90 (see FIG. 21) according to electric signals and a photodiode receiver, that is, the receiver 120, that converts received optical signals into electric signals, the VLSI 130, etc., are formed on the lower surface of the silicon substrate 10 by a general complementary metal oxide semiconductor (CMOS) process.

Referring to FIG. 21, the pair of mirror grooves 80 inclined at a predetermined angle (preferably, about 45°) to be opposite to each other are formed on the upper surface of the optical waveguide positioned on each via hole 70.

Then, the laser diode 100 and the photodiode 110 each is attached to the lower surface of the silicon substrate 10 by using the solder pump 140, etc., to close each via hole 70.

At this time, the mirror groove 80 may be formed by using the laser or the blade. As described below, the inclination angle can be accurately controlled when using an imprint technology and an etching method using a silicon wafer and a crystal grown silicon. In order to increase the reflectivity of the mirror groove 80, the metal may be deposited on the inclined portion.

FIGS. 22 to 25 are cross-sectional views for explaining one example of a method for forming a mirror groove to which the fourth embodiment of the present invention is applied and shows a method for forming the mirror groove 80 by using the imprint technology.

Referring to FIG. 22, a resist layer 200 is first applied on the upper cladding layer 60 of the optical waveguide to be manufactured by the imprint. At this time, as the resist layer 200, a polymer-based resin is generally used and in the case of the ultraviolet ray (UV) method, it is preferable to use an ultraviolet ray curable polymer system.

Moreover, an application method of the resist layer 200 may use various methods such as spin coating, droplet dispensing, spray, etc., but the spin coating method is preferable.

Referring to FIGS. 23 and 24, after pressurizing the upper surface on the resist layer at a predetermined pressure by contacting the upper surface of the resist layer 200 and a stamper 300 on which the pattern 300a for forming the mirror grooves, the upper surface of the resist layer 200 is exposed by the ultraviolet rays or is applied with heat.

At this time, the ultraviolet rays transmit the stamper 300 and are irradiated to the resist layer 200. Therefore, the resist layer 200 that is exposed by the ultraviolet rays or applied with heat is cured and the stamper 300 is then separated, such that the resist pattern 200a for forming the mirror groove is formed.

Generally, the lithography process using the imprint is required to cure the resist layer 200 by ultraviolet rays or heat energy. In other words, in the thermal imprinting, the stamper 300, the optical waveguide or both thereof are heated to soften the resist layer 200 and then cool down the resist layer 200 during the imprinting process, such that the imprinted resist pattern 200a is solidified, thereby retaining the imprinted shape after removing the stamper 300.

Meanwhile, in the ultraviolet curable imprinting, a transparent stamper 300 applies pressure to the upper cladding layer 60 coated with a liquid-phase photopolymer resist layer 200. After being exposed by ultraviolet rays, the resist layer 200 is polymerized into a solid by a photoinitiator within the resist, such that the solidified resist pattern 200a remains in the cured resist layer 200. In order to completely form the resist pattern 200a, the stamper 300 and/or the silicon substrate 10 on which the optical waveguide is formed may be applied with pressure during the curing process.

Referring to FIG. 25, the remaining resist is removed through the dry etching method such as the reactive ion etching (RIE) using the resist pattern 200a as the etch stop mask, such that the optical waveguide formed with the foregoing mirror grooves 80 is formed. The formed mirror grooves 80 are preferably formed to be inclined at a predetermined angle (preferably, 45°) as described above.

In the structure, it is important to accurately form the inclination angle of the mirror groove 80. In other words, when forming the inclination angle of 45°, a technology that accurately implement 45° is needed. To this end, in the fourth embodiment, it is possible to accurately implement the inclination angle by using the imprint technology.

Meanwhile, when performing the dry etching of the resist pattern 200a, selectivity between the optical waveguide and the resist is used, such that it is possible to transition the imprinted inclination angle and other inclination angles. For example, when the optical waveguide is lower in an etching rate than the resist, the inclination angle is smaller than the imprinted inclination angle. Therefore, it is possible to easily control the inclination angle of the mirror groove 80 by controlling the selectivity between two materials and the imprinted inclination angle. In other words, when the imprint method is used, it is possible to easily control the inclination angle.

FIGS. 26 to 28 are cross-sectional views for explaining another example of a method for forming a mirror groove to which the fourth embodiment of the present invention is applied and shows the method for forming the mirror groove 80 by using a regular crystal direction of a silicon layer 400 for forming the mirror groove made of the same material as the silicon substrate 10.

Referring to FIG. 26, the silicon layer 40 having a predetermined thickness formed on the upper cladding layer 60 of the optical waveguide or the silicon layer 40 to which the silicon substrate is attached may be used. If the silicon layer 400 is etched in a crystal direction to have a predetermined inclination angle, it means that the silicon wafer or the grown silicon can be used.

A mask pattern 500 for forming an auxiliary mirror groove is formed on the silicon layer 400 by the general photolithography process. At this time, as the mask pattern 500, for example, photoresist, $SiO_2$, or $SiN_x$, etc., may be used.

Referring to FIG. 27, the auxiliary mirror groove 80a is formed in the same shape as the foregoing mirror groove 80 by etching the silicon layer 400, for example, using the wet or dry etching method (preferably, wet etching) and the mask pattern 500 is then removed, thereby forming the silicon pattern 400a.

At this time, the wet etching method of the silicon 400 may use a solution (for example, HNA, etc.) prepared by mixing, for example, hydrofluoric acid, nitric acid, and acetic acid solutions and etching rate, surface roughness, and a degree of isotropy can be controlled according to volume percentage of each solution.

Meanwhile, when etching the silicon layer 400, it is possible to form the auxillary mirror groove 80a to be inclined at more accurate angle (preferably, 45°) by the regular crystal direction of the silicon.

Referring to FIG. 28, the remaining resist is removed through the dry etching method such as the reactive ion etching (RIE) using the silicon pattern 400a as the etch stop mask, such that the optical waveguide formed with the foregoing mirror grooves 80 is formed. At this time, the formed mirror grooves 80 are preferably formed to be inclined at a predetermined angle (preferably, 45°) so that they are opposite to each other as described above.

Although the preferred embodiments described the optical interconnection structure and the method for manufacturing the same, the present invention is not limited thereto but various modifications can be made in the present invention without departing from the spirit or scope of the inventions. Thus, it is intended that the present invention covers the modifications and variations of this invention provided they come within the scope of the appended claims and their equivalents.

What is claimed is:

1. An optical interconnection structure comprising:
   a silicon substrate on which a first groove for a lens is formed to have a curvature radius on the upper surface thereof;
   a silica layer that is formed on the silicon substrate including the first groove for a lens, the silica layer including a first curved portion retaining the shape of the first groove for a lens, the silica layer including a first curved portion retaining the shape of the first groove for a lens;
   a first via hole formed on a lower surface of the silicon substrate to expose the first curved portion;
   an optical waveguide comprising a lower cladding layer formed on the upper surface of the silica layer, the lower cladding layer having a depth sufficient to fill the first curved portion;
   a core layer formed on the upper surface of the lower cladding layer; and
   an upper cladding layer formed on the upper surface of the core layer.

2. The optical interconnection structure according to claim 1, further comprising: a second curved portion of the silica layer retaining the shape of a second groove for a lens and a second via hole, spaced apart from the first curved portion and the first via hole, respectively, by a predetermined interval;
   a laser diode coupled to a lower surface of the silicon substrate under the first via hole and a photodiode coupled to the lower surface of the silicon substrate under the second via hole;
   a driver coupled to the lower surface of the silicon substrate for driving the laser diode; and
   a receiver coupled to the lower surface of the silicon substrate for converting received optical signals into electric signals.

3. The optical interconnection structure according to claim 2, further comprising a first mirror groove disposed over the first via hole and positioned to reflect light transmitted through the first via hole into the optical waveguide; and
   a second mirror groove disposed over the second via hole and positioned to reflect light from the optical waveguide into the second via hole.

4. An optical interconnection structure comprising:
   a silicon substrate on which a first groove for a lens is formed to have a curvature radius on the upper surface thereof;
   a silica layer that is formed on the silicon substrate including the first groove for a lens, the silica layer including a first curved portion retaining the shape of the first groove for a lens;
   a first via hole formed on a lower surface of the silicon substrate to expose the first curved portion;
   a first microlens disposed in the first curved portion;
   a second groove for a lens formed on the silicon substrate;
   a second curved portion comprising a portion of the silica layer retaining the shape of the second groove for a lens;
   a second microlens disposed in the second curved portion;
   a second via hole disposed under the second microlens;
   a laser diode coupled to a lower surface of the silicon substrate under the first via hole;
   a photodiode coupled to the lower surface of the silicon substrate under the second via hole;
   a driver coupled to the lower surface of the silicon substrate for driving the laser diode;
   a receiver coupled to the lower surface of the silicon substrate for converting received optical signals into electric signals; and
   an optical interconnection member comprising first and second fibers coupled to the upper surface of the silica layer,
   wherein the optical interconnection member is coupled to the upper surface of the silica layer to transmit light from the first microlens to the first optical fiber, and to transmit light from the second optical fiber to the second microlens.

5. A method for manufacturing an optical interconnection structure comprising:
   (a) forming a first groove for a lens having a curvature radius on the upper surface of a silicon substrate;
   (b) forming a silica layer on the entire upper surface of the silicon substrate including the groove formed with the lens, the silica layer filling the groove for a lens to form a first curved portion;
   forming an optical waveguide by sequentially stacking a lower cladding layer, a core layer, and an upper cladding layer on the entire upper surface of the silicon substrate; and
   forming via holes on the lower surface of the silicon substrate to expose the first curved portion.

6. The method for manufacturing an optical interconnection structure according to claim 5, further comprising:
   forming a second groove for a lens, wherein the step of forming a silica layer fills the second groove for a lens;
   forming a second via hole under the second groove for a lens;
   attaching a laser diode and a photodiode to a lower surface of the silicon substrate under the first and second via holes, respectively; and
   attaching a driver for driving the laser diode and a receiver for converting received optical signals into electric signals to the lower surface of the silicon substrate.

7. The method for manufacturing an optical interconnection structure according to claim 6, further comprising:
   forming a first mirror groove over the first via hole on the upper surface of the optical waveguide, the first mirror groove being arranged to reflect light from the first via hole into the optical waveguide; and forming a second mirror groove over the second via hole on the upper surface of the optical waveguide, the second mirror groove being arranged to reflect light from the optical waveguide into the second via hole.

* * * * *